US010921197B2

(12) United States Patent
Ferng et al.

(10) Patent No.: US 10,921,197 B2
(45) Date of Patent: Feb. 16, 2021

(54) VISUALIZATION AND MANIPULATION OF MICRO-SCALE CALORIMETER CHAMBER DATA MATRICES

(71) Applicant: The Boeing Company, Chicago, IL (US)

(72) Inventors: William R. Ferng, Sammamish, WA (US); John N. Harris, Seattle, WA (US); Jeffrey C. Mentel, Stanwood, WA (US); Gregory L. Hooker, Everett, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 14/939,686

(22) Filed: Nov. 12, 2015

(65) Prior Publication Data

US 2017/0138803 A1    May 18, 2017

(51) Int. Cl.
| | |
|---|---|
| *G01K 17/00* | (2006.01) |
| *G06F 16/00* | (2019.01) |
| *G06F 11/10* | (2006.01) |
| *G11C 11/419* | (2006.01) |
| *G11C 11/413* | (2006.01) |

(52) U.S. Cl.
CPC ........ *G01K 17/006* (2013.01); *G06F 11/1008* (2013.01); *G06F 16/00* (2019.01); *G11C 11/413* (2013.01); *G11C 11/419* (2013.01)

(58) Field of Classification Search
CPC .................... G01K 17/006; G01K 17/025
See application file for complete search history.

(56) References Cited

U.S. PATENT DOCUMENTS

| | | | | |
|---|---|---|---|---|
| 4,926,356 A | * | 5/1990 | Kucera | .................. G01N 25/30 374/31 |
| 7,021,820 B2 | * | 4/2006 | Chippett | ................ G01K 17/00 374/33 |
| 2004/0014233 A1 | * | 1/2004 | Bannister | ........... G01N 25/4866 436/155 |

(Continued)

OTHER PUBLICATIONS

Lyon et al "Principles and Practices of Microscale Combustion Calorimetry",Report No. DOT/FAA/TC-12/53, US Department of Transportation Federal Aviation Administration, Apr. 2013 Revised Dec. 2014.

(Continued)

*Primary Examiner* — Mushfique Siddique
(74) *Attorney, Agent, or Firm* — Parsons Behle & Latimer (57) ABSTRACT

A method for microscale calorimeter chamber data manipulation and visualization includes receiving a dataset from a microscale calorimeter chamber. The dataset is indicative of heat release rates for a test material as a function of a temperature applied by the microscale calorimeter chamber to the test material. The method further includes generating a baseline for correcting the heat release rates for the test material based on a selected temperature interval of the dataset. The method also includes generating a modified dataset that includes modified heat release rate values for the test material based on the baseline. The method includes generating a graphical user interface and displaying, via the graphical user interface, a graphical depiction of the modified dataset.

16 Claims, 8 Drawing Sheets

(56) References Cited

U.S. PATENT DOCUMENTS

| | | | | |
|---|---|---|---|---|
| 2006/0288979 A1* | 12/2006 | Ancimer | ............ | F02B 23/0675 |
| | | | | 123/304 |
| 2011/0313713 A1* | 12/2011 | Hoult | .................. | G01N 25/486 |
| | | | | 702/136 |
| 2012/0150414 A1* | 6/2012 | Huang | ................. | G01M 15/08 |
| | | | | 701/101 |
| 2014/0047096 A1* | 2/2014 | Kupershmidt | ......... | G06F 11/34 |
| | | | | 709/224 |

OTHER PUBLICATIONS

Lyon et al "Steady heat release rate by the moment—area method" Published Sep. 17, 2007 John Wiley & Sons, Ltd., InterScience 32:199-212, www.interscience.wiley.com.

\* cited by examiner

VISUALIZATION AND MANIPULATION OF MICRO-SCALE CALORIMETER CHAMBER DATA MATRICES

FIELD OF THE DISCLOSURE

This disclosure relates generally to the field of visualization and manipulation of micro-scale calorimeter chamber data matrices.

BACKGROUND

Micro-scale calorimeter chamber (MCC) devices are used in multiple industries, including aerospace, to measure and determine values corresponding to various aspects of combustion. Within the MCC device, a temperature applied to a sample, while in the presence of oxygen gas and an inert feed gas, may increase at a constant rate while the MCC device measures the relative levels of the oxygen gas and the feed gas. Combustion effectively occurs resulting in matrices of raw measurement data.

The raw measurement data may be subject to inaccuracies. For example, as gases within the MCC device increase in temperature, they may be read as a decrease in the flow of oxygen and interpreted by the MCC device as corresponding to combustion, or heat release. This may result in "artifacting" in the raw measurement data. If plotted, this "artifacting" may be shown as a ridge, which may erroneously be interpreted as corresponding to heat release from the sample even though no combustion has occurred. Thus, MCC data may be inaccurate. The inaccuracies of the MCC data may make it unsuitable to perform a detailed analysis of the sample combustion.

Typical systems for visualizing MCC data may be subject to the inaccuracies associated with the MCC device. An additional shortcoming of typical systems for visualizing MCC data is that they may visualize combustion data associated with a sample as a whole, without breaking down the data into individual combustion "peaks" associated with different compositions of the sample. Thus, in order to make the MCC data usable for such an analysis, guesses must be made to break down the data into individual "peaks."

As such, there is a longstanding need within the industry of combustion analysis for a system that can improve the accuracy of MCC data and automatically calculate and visualize values and functions that are useful for interpreting the MCC data. Further, there is a need for a system that can automatically break down MCC data into component peaks without relying on mere guesswork.

SUMMARY

Disclosed are systems and methods that overcome at least one of the disadvantages or shortcomings discussed above. By modifying micro-scale calorimeter chamber (MCC) data to account for artifacting using a baseline, one or more values corresponding to the MCC data, such as a total heat release (THR) and an effective heat release capacity (HRC), may be more accurately calculated as compared to calculations that use raw MCC data. Further, a more accurate visualization of the MCC data may be generated. Also, the disclosed systems and methods may automatically generate individual peaks corresponding to different compositions of a combustion sample. Likewise, the disclosed systems and methods may calculate THR data for a composite material based on stored data corresponding to individual materials that have been tested separately and generate an accurate visualization of data corresponding to the individual materials and the composite.

In an embodiment, a method for microscale calorimeter chamber data manipulation and visualization includes receiving a dataset from a microscale calorimeter chamber. The dataset is indicative of heat release rates for a test material as a function of a temperature applied by the microscale calorimeter chamber to the test material. The method further includes generating a baseline for correcting the heat release rates for the test material based on a selected temperature interval of the dataset. The method also includes generating a modified dataset that includes modified heat release rate values for the test material based on the baseline. The method includes generating a graphical user interface and displaying, via the graphical user interface, a graphical depiction of the modified dataset.

In an embodiment, a system for microscale calorimeter chamber data manipulation and visualization includes an MCC device. The MCC device generates datasets indicative of heat release rates for test materials as a function of a temperature applied by the microscale calorimeter to the test materials. The system further includes a baseline correction module adapted to generate baselines for correcting the heat release rates for the test materials based on selected temperature intervals of the datasets. The baseline correction module may further be adapted to generate modified datasets that include modified heat release rates for the test material based on the baseline. The system also includes an analysis module adapted to display a graphical depiction of the modified dataset via a graphical user interface. The system includes a display device adapted to display the graphical user interface.

In an embodiment, a non-transitory computer-readable medium stores instructions that, when executed by a processor, cause the processor to perform operations. The operations include receiving a dataset generated by a microscale calorimeter chamber. The dataset is indicative of heat release rates for a test material as a function of a temperature applied by the microscale calorimeter chamber to the test material. The operations further include generating baseline data for correcting the heat release rates for the test material based on a selected temperature interval of the dataset. The operations also include generating a modified dataset that includes modified heat release rate values for the test material based on the computed baseline data. The operations include generating a graphical user interface that includes a display that graphically depicts the modified dataset.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the spirit and scope of the invention as defined by the appended claims.

DETAILED DESCRIPTION

Figure 1:
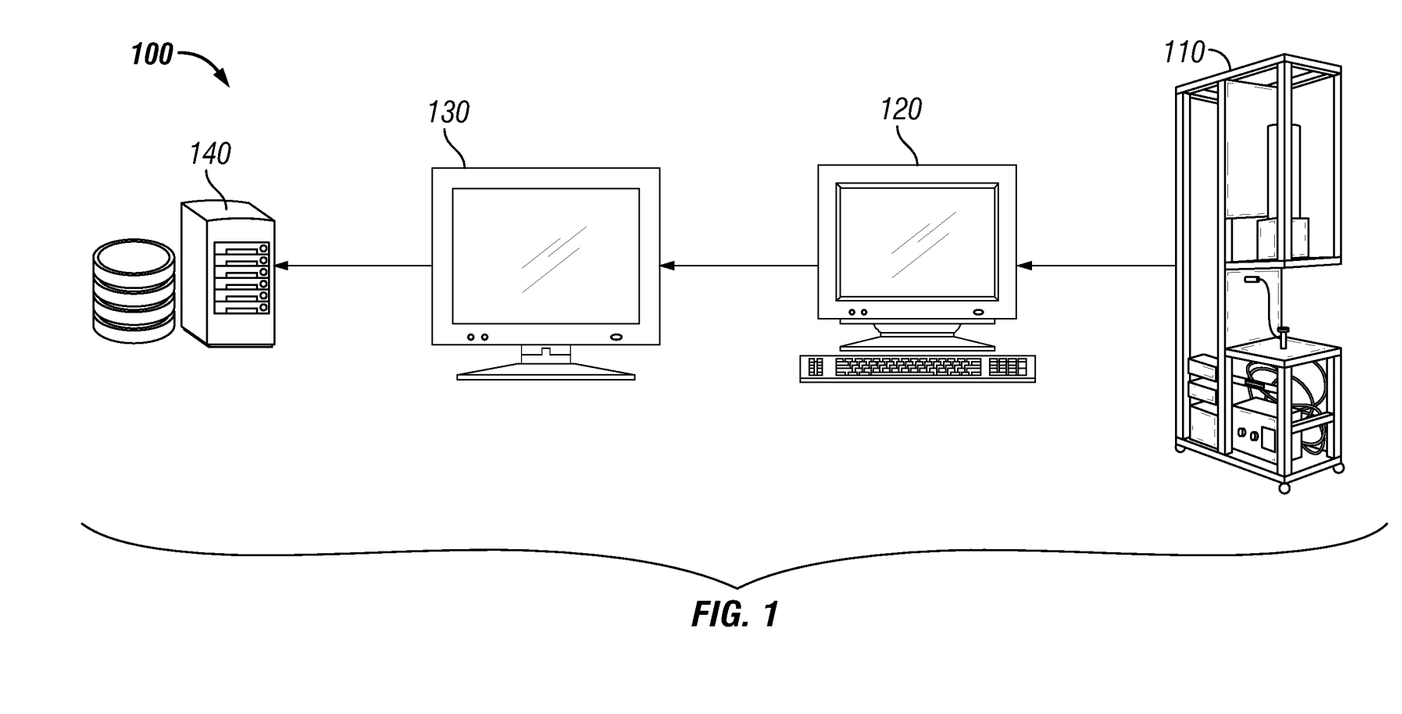
FIG. 1 is a schematic diagram depicting an embodiment of a system for microscale calorimeter chamber (MCC) data manipulation and visualization.

Referring to FIG. 1, an embodiment of a system 100 for microscale calorimeter chamber (MCC) data manipulation and visualization is shown. The system 100 may include an MCC device 110, a data collector device 120, an analysis device 130, and a database 140. As described herein, the system 100 may advantageously enable the manipulation and visualization of datasets generated by the MCC device 110 in ways that improve the accuracy and utility of the information contained within the datasets as compared to typical visualization techniques.

The devices 110, 120, 130 and the database 140 may be networked together to enable the transmission of data therebetween. For example, in some embodiments, the devices 110, 120, 130 and the database 140 may share a filesystem (not shown) over a local area network (LAN). In other embodiments, the devices 110, 120, 130 and the database 140 may communicate via a wide area network (WAN), such as the Internet. Alternatively, some of the devices 110, 120, 130, and the database 140 may be communicatively coupled directly via serial or parallel data links. For example, the MCC device 110 may be communicatively coupled to the data collector device 120, while the data collector device 120 and the analysis device 130 may share a filesystem (e.g., a network drive) over a LAN.

The data collector device 120, the analysis device 130, and the database 140 may be, or may include, computing devices. For example, the data collector device 120, the analysis device 130, and the database 140 may each include at least one processor and memory. The at least one processor may include a central processing unit (CPU), a graphical processing unit (GPU), a digital signal processor (DSP), another type of processing element, or combinations thereof. The memory may include registers, data caches, random access memory (RAM), read only memory (ROM), magnetic memory, optical memory, other types of memory elements, or combinations thereof. Alternatively, the data collector device 120, the analysis device 130, or both, may be implemented as hardwired or programmed logical circuitry. For example, the data collector device 120 and the analysis device 130 may be implemented using logic circuit gates, field programmable gate arrays (FPGA), application specific integrated circuits (ASIC), other types of logical circuitry, or combinations thereof. Further, although the data collector device 120, the analysis device 130, and the database 140 are depicted in FIG. 1 as distinct, in some embodiments, one or more components or modules may be shared between them. As an example, in some embodiments, the data collector device 120, the analysis device 130, and the database 140 may be implemented as one device.

During operation, the MCC device 110 may apply heat to a sample of test material to generate a dataset. The dataset may include matrices indicative of heat release rates for the sample as a function of a temperature applied by the microscale calorimeter chamber to the test material. The heat release rates may be included as a field of values of the dataset. Alternatively, the data set may include fields of values that enable the calculation of the heat release rates. In some embodiments, a particular field of the dataset may include a plurality of time values. The time values may be incremented in half-second steps, although other increment steps may be used. Each time value may correspond to one or more field values associated with measurements taken while heat is applied to the sample. The one or more field values may include a temperature, a heat release rate value, a nitrogen flow rate value, an oxygen flow rate value, a total flow rate value, a heating rate value, another value corresponding to the heating of the sample, or combinations thereof. From the field values, it may be possible to determine heat release rates for the test material. The operation of the MCC device 110 is further described with reference to FIG. 2.

The dataset may be collected by the data collector device 120 and output as a computer-readable file (e.g., a text file, a comma separated value file, etc.). The computer-readable file may be stored to a file system (e.g., a network drive) and may thereafter be accessed by the analysis device 130. Alternatively, in some embodiments, the dataset may be transmitted directly to analysis device 130 from the data collection device 120.

After receiving the dataset, the analysis device 130 may manipulate the dataset to generate a modified dataset that more accurately reflect heat release rates for a test sample. For example, the analysis device 130 may generate a baseline for correcting the heat release rates for the test material based on a selected temperature interval of the dataset. The modified dataset may include modified heat release rates for the sample based on the generated baseline. The analysis device 130 may have a graphical user interface to display a graphical visualization of the modified dataset and other information as described herein. The modified dataset, the raw dataset, and any calculated values generated by the analysis device 130 may be stored at the database 140 for future reference.

An advantage of the system 100 is that a more accurate dataset may be generated as compared to systems that do not perform a baseline correction. The system 100 may also automatically calculate and generate visualizations for values and functions that are useful for interpreting the MCC data, as opposed to systems that include no or few functions for interpretation of the MCC data. Further benefits and advantages may be apparent to persons of ordinary skill in the art having the benefit of this disclosure.

Figure 2:
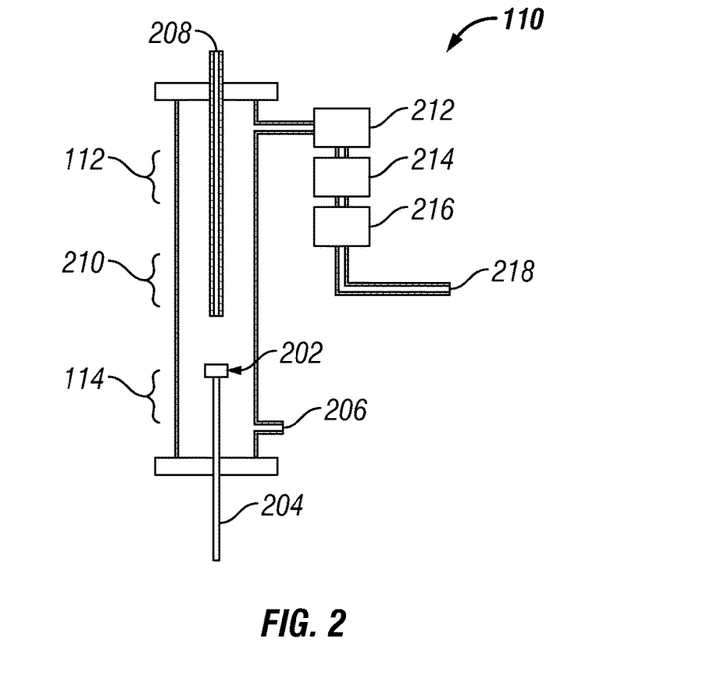
FIG. 2 is a schematic diagram depicting an embodiment of an MCC device.

Referring to FIG. 2, an understanding of the functioning of the MCC device 110 may aid in understanding the potential advantages associated with this disclosure. The MCC device 110 may initiate controlled combustion within an interior of the MCC device 110. The interior may be described with respect to various portions. For example, the MCC device may include a pyrolyzer portion 114, a mixing portion 210, and a combustor portion 112.

Within the pyrolyzer portion 114, a sample cup 202 may be configured to hold a test material (e.g., a sample coupon) to be combusted. A purge gas inlet 206 may introduce a flow of purge gas into the pyrolyzer portion 114, which may flow upward toward the mixing portion 210. The purge gas may include an inert gas that has negligible effect on combustion, such as nitrogen gas. As the purge gas flows, the sample cup 202 may apply an incremental temperature increase to the test material. Eventually, the test material reaches a temperature of thermal degradation, resulting in the chemical breakdown of the sample into gaseous components. The sample cup 202 may be positioned in contact with a thermocouple 204. The thermocouple may continuously measure the temperature applied to the sample.

Within the mixing portion, an oxygen inlet 208 may introduce a flow of oxygen gas. As the sample breaks down, some of the components may be volatile and react with the oxygen gas resulting in oxidized components while other components may be non-volatile. The purge gas, the remaining oxygen gas, the non-volatile components, and any byproduct gases may flow to the combustor portion 112 enabling the components to fully react (e.g., combust) before being vented through an exhaust outlet 218.

After combustion, but before being expelled through the exhaust outlet 218, the remaining gases may pass through a scrubber 212, a flow meter 214, and/or an oxygen sensor 216. The scrubber 212 may remove gases and particles that are the byproducts of the combustion. The flow of the exiting gases may be measured at the flow meter 214 and the remaining oxygen gas may be measured at the oxygen sensor 216. The data detected and measured during this process may then be compiled to form a dataset that may be passed to the data collector device 120 as described herein.

The dataset may be indicative of heat release rates for the sample as a function of a temperature applied by the microscale calorimeter chamber to the test material as measured by the thermocouple 204. The heat release rates may be determined from the dataset because the number of mole of oxygen consumed during the combustion is strongly correlated to the amount of heat being released by the sample. By also using the thermocouple 204 as a feedback input, a temperature of the sample may be raised at a defined and constant rate. Typically, the temperature may be raised by 1° C. per second. The thermocouple 204, the flow meter 214, and the oxygen sensor 216 may produce real time measurements of nitrogen and oxygen flow. For example, the measurements may be taken every half second.

The measurements may be compiled to form matrices within the dataset. For example, the dataset may include a plurality of time values corresponding the half second time steps at which measurements were recorded. Each time value may corresponding to one or more field values. The field values may be measurement values taken by the thermocouple 204, the flow meter 214, the oxygen detector 216, one or more other sensors, or combinations thereof. The field values may also include values that may be computed from the measurements. In some embodiments, the field values include a temperature, a heat release rate value, a nitrogen flow rate value, an oxygen flow rate value, a total flow rate value, a heating rate value, another measurement or calculation, or combinations thereof.

The dataset may include some inaccuracies due to the process used to generate the dataset. For example, as the inert feed gas and oxygen are heated, the gases expand. This expansion is not associated with the combustion of the sample. Nonetheless, because the gases expand, the flow meter 214 and the oxygen detector 216 may measure a change (e.g., a decrease) in the amount of oxygen. When interpreted as heat release rates, this change in the amount of oxygen may erroneously indicate heat release from the sample, where no heat release, or combustion, has occurred. Thus, the dataset received from the MCC device 110 includes artifacts (e.g., inaccuracies) in the form of a sudden jump, or shoulder. Using the analysis device 130, as described herein, these artifacts may be corrected to increase the accuracy and usefulness of the MCC data.

Figure 3:
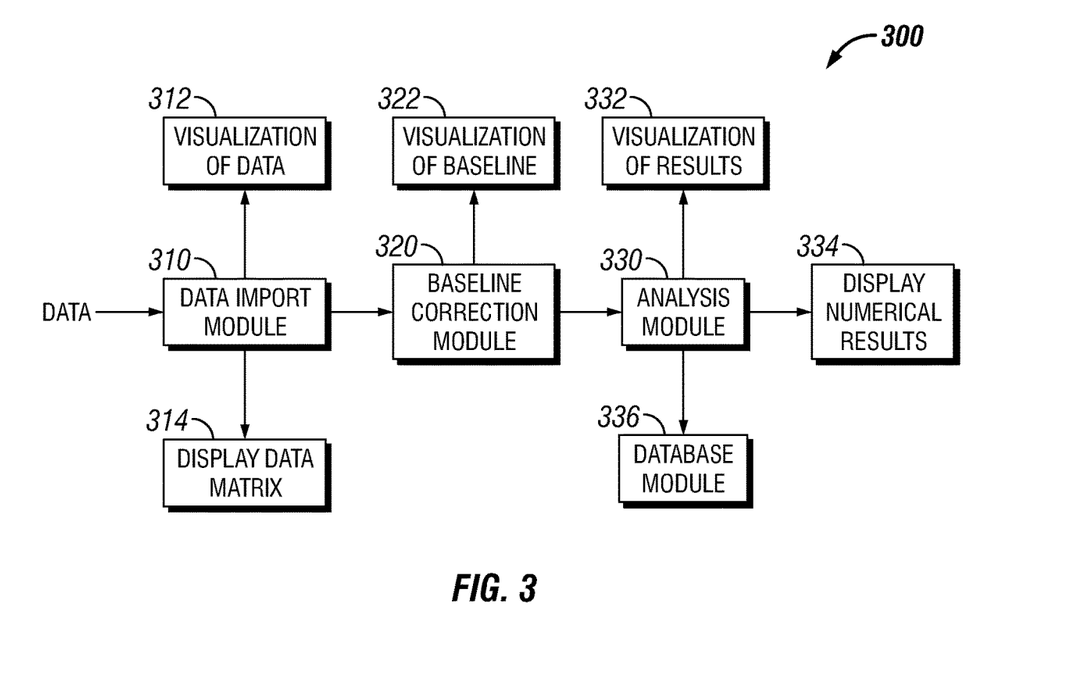
FIG. 3 is a block diagram depicting an embodiment of a system for MCC data manipulation and visualization.

Referring to FIG. 3, an embodiment of the analysis device 130 of FIG. 1 is depicted as a system 300 of modules. Each module performs operations for the manipulation and visualization of a dataset received from the data collector device 120. For example, the system 300 may include a data import module 310, a baseline correction module 320, and an analysis module 330. Although, not depicted in FIG. 3, each of the modules 310, 320, 330 may communicate with a graphical user interface to communicate results associated with the dataset to users and to receive user input regarding calculations to be performed using the dataset. Embodiments of the graphical user interface are further described with reference to FIGS. 4-10.

In some embodiments, the system 300 may be implemented as computer-readable instructions stored at the analysis device 130. For example, the system 300 may be implemented using an object-oriented programming language, such as Java, Python, C++, Visual Basic, .NET, etc. In that instance, each of the modules 310, 320, 330 may correspond to an object or instantiation of a class-level description. Alternatively, the system 300 may be implemented using separate hardware devices, hard-wired circuitry, or other types of programmable media. Further, even though FIG. 3 depicts each of the modules 310, 320, 330 as distinct, in some embodiments, one or more components or functions may be shared between them.

During operation, the data import module 310 may receive a dataset generated by an MCC device, such as the MCC device 110 of FIG. 1. The data import module 310 may communicate with a module for displaying a data matrix 314 taken from the dataset. The module for displaying the data matrix 314 may output numerical values corresponding to the data included in the data matrix. As an example, a display portion of the graphical user interface may depict a table that includes the numerical values organized according to field values and time values.

The data import module 310 may further communicate with a module for visualizing the data 312. The module for visualizing the data 312 may output a graphical display, via the graphical user interface, that depicts the numerical values associated with the data matrix taken from the dataset.

The baseline correction module 320 may receive at least a portion of the dataset from the data import module 310. In order to correct inaccuracies associated with the dataset, the baseline correction module 320 may calculate a corrective baseline according to a selected temperature interval of the dataset. Operations for calculating the corrective baseline are further described with reference to the method of FIG. 11.

The baseline correction module 320 may communicate with a module for visualizing the baseline 322. The module for visualizing the baseline 322 may output a graphical display, via the graphical user interface, that depicts the baseline. In some embodiments, the baseline may be superimposed on the graphical display that depicts the numerical values associated with the data matrix.

The analysis module 330 may receive the calculated baseline from the baseline correction module 320 and may perform multiple calculations to generate a modified dataset and to determine numerical results associated with the dataset. The modified dataset may be generated according to corrections made based on the baseline. The numerical results may include values related to the combustion of the sample, such as total heat release values, combustion progress values, temperature values of different combustion phases, heating rate values of the MCC as a function of temperature, total heat release values, effective heat release capacity values, heat release capacity values at a main peak, main peak temperature values, average heating rate values, low temperature line values, high temperature line values, baseline heat release rate values, or combinations thereof.

In computing the modified dataset and numerical results, the analysis module may implement a moment-area method to model the combustion of a sample. The moment-area method may be based on a method in statistics for characterizing probability distribution by the moments of its variate. A short summary of the moment-area method may aid in the understanding of the analysis performed by the analysis module. In particular, if $F(x)$ is a positive-definite, single-valued, normalizable function with respect to a zero baseline, such that:

$$F(x) \geq 0, F(0) = F(\infty) = 0,$$

Then, $F(x)$ may be normalized to obtain a density function:

$$f(x) = \frac{F(x)}{\int_0^\infty F(x)dx} \geq 0, \quad \int_0^\infty f(x)dx = 1.$$

The mean of the continuous variable x may correspond to a first moment:

$$\mu = \int_0^\infty x f(x) dx$$

The standard deviation may correspond to a second moment:

$$\sigma^2 = \int_0^\infty (x-\mu)^2 f(x) dx.$$

Figure 12:
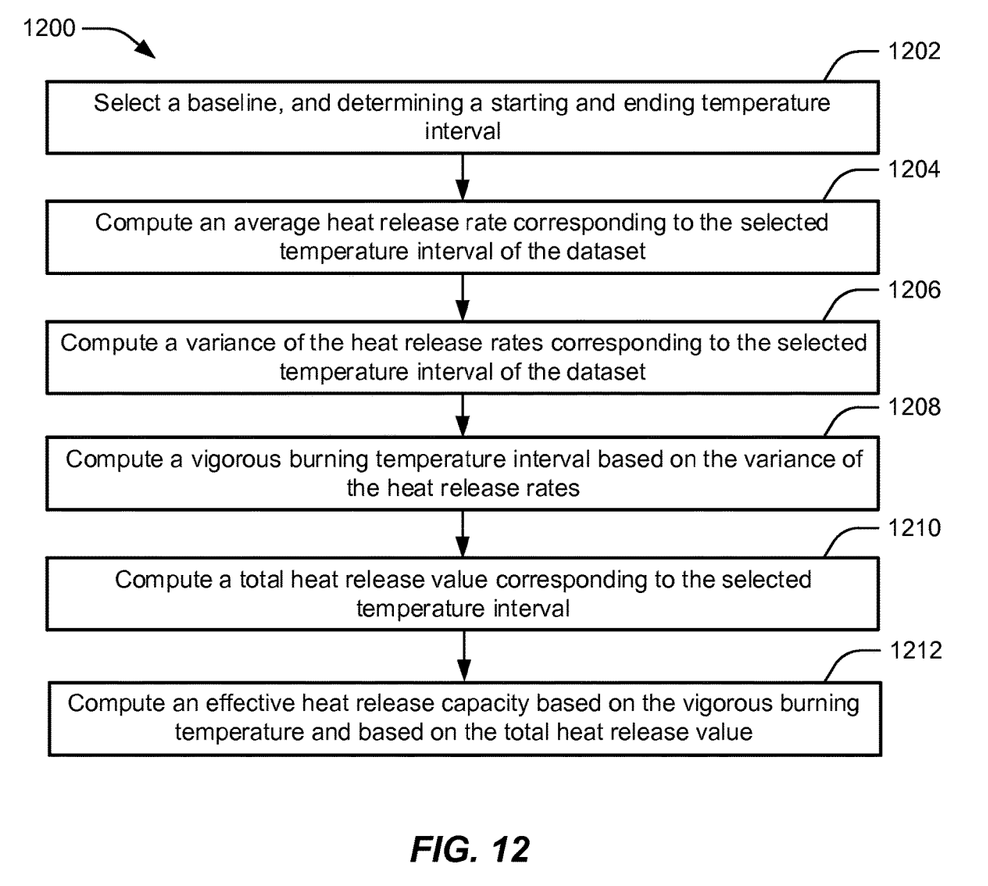
FIG. 12 is a flow diagram depicting an embodiment of a method of modifying a dataset and generating analysis values.

The moment-area method may be applied to data received from a MCC device. For example, the functions above may implemented using data from the MCC device, as follows:

$$F(x) = HRR(t),$$

$$f(x) = \frac{HRR(t)}{THR},$$

$$THR = \int_0^\infty HRR(t) dt,$$

where $HRR(t)$ corresponds to heat release rate values as a function of time and THR corresponds to a total heat release. From these equations, the mean temperature for the heat release rate may be calculated as a first moment and the variance (and standard deviation) may be calculated as a second moment. Further, based on the two moments, a vigorous burning temperature interval, a total heat release, and an effective heat release capacity may be calculated. The operations performed by the analysis module 330 are further described with reference to the method of FIG. 12.

The analysis module 330 may further calculate multiple component peaks corresponding to the heat release rate values. For example, the heat release rate values may be the result of a compilation of multiple individual sets of heat release rates corresponding to different components of the combustion sample within the MCC. The calculated component peaks, when added may be substantially equal to the heat release rates of the heat release rate values. This analysis is further described with reference to FIG. 10.

The analysis module 330 may communicate with a module for visualizing the results 332. The module for visualizing the results 332 may output a graphical display, via the graphical user interface, that depicts the modified dataset. The graphical display may further depict one or more calculated values or sets of values associated with the modified dataset. For example, the graphical display may depict a computed total heat release value, a heat release rate plot, a combustion progress plot, temperature markers that indicate temperatures associated with particular burn phases of the sample being tested, one or more other results or plots described herein, or combinations thereof. In some embodiments, the graphical display depicting the modified dataset may be superimposed on the graphical display that depicts the numerical values associated with the data matrix, the baseline, or both.

In some embodiments the analysis module 330 may calculate total heat release (THR) data from stored MCC data corresponding to multiple materials that have been tested separately. The calculated data and stored data may be visualized together in a plot or other suitable manner that is representative of the materials being tested as part of a single composite. The heat release values corresponding to the composite panel can be estimated by summing the corrected heat release of component materials of the composite. The corrected heat release of each component material may be calculated by the analysis module 330 by multiplying the total heat release of each separately tested component by its weight as a percentage of the composite panel. Visualizations of the heat release of each material and the composite panel are further described with reference to FIG. 10.

The analysis module 330 may also communicate with a module for displaying numerical results 334. The module for displaying numerical results 334 may output numerical values corresponding to the calculated numerical results. As an example, a display portion of the graphical user interface may depict a list identifying the calculated numerical results. The calculated numerical results may include a total heat release value, an effective heat release capacity value, a heat release capacity at main peak value, a main peak temperature, an average heating rate value, a low temperature line value, a high temperature line value, a baseline heat release rate value, one or more other result values, or combinations thereof. Further, in some embodiments, one or more of the numerical results may be superimposed on the graphical display depicting the modified dataset.

The analysis module 330 may further communicate with a database module 336. The database module 336 may store the dataset, the modified dataset, data associated with the baseline, one or more of the calculated numerical results, or combinations thereof. In some embodiments, the database module 336 may interface with a relational database management system using a structured query language (SQL).

An advantage of the system 300 is that MCC data may be corrected to account for the inaccuracies produced by the process performed by the MCC device. Further, additional calculations may be automatically performed to render the raw MCC data usable for combustion analysis of the sample. Other benefits and advantages of the system 300 will be apparent to persons of ordinary skill in the art having the benefit of this disclosure.

Figure 4:
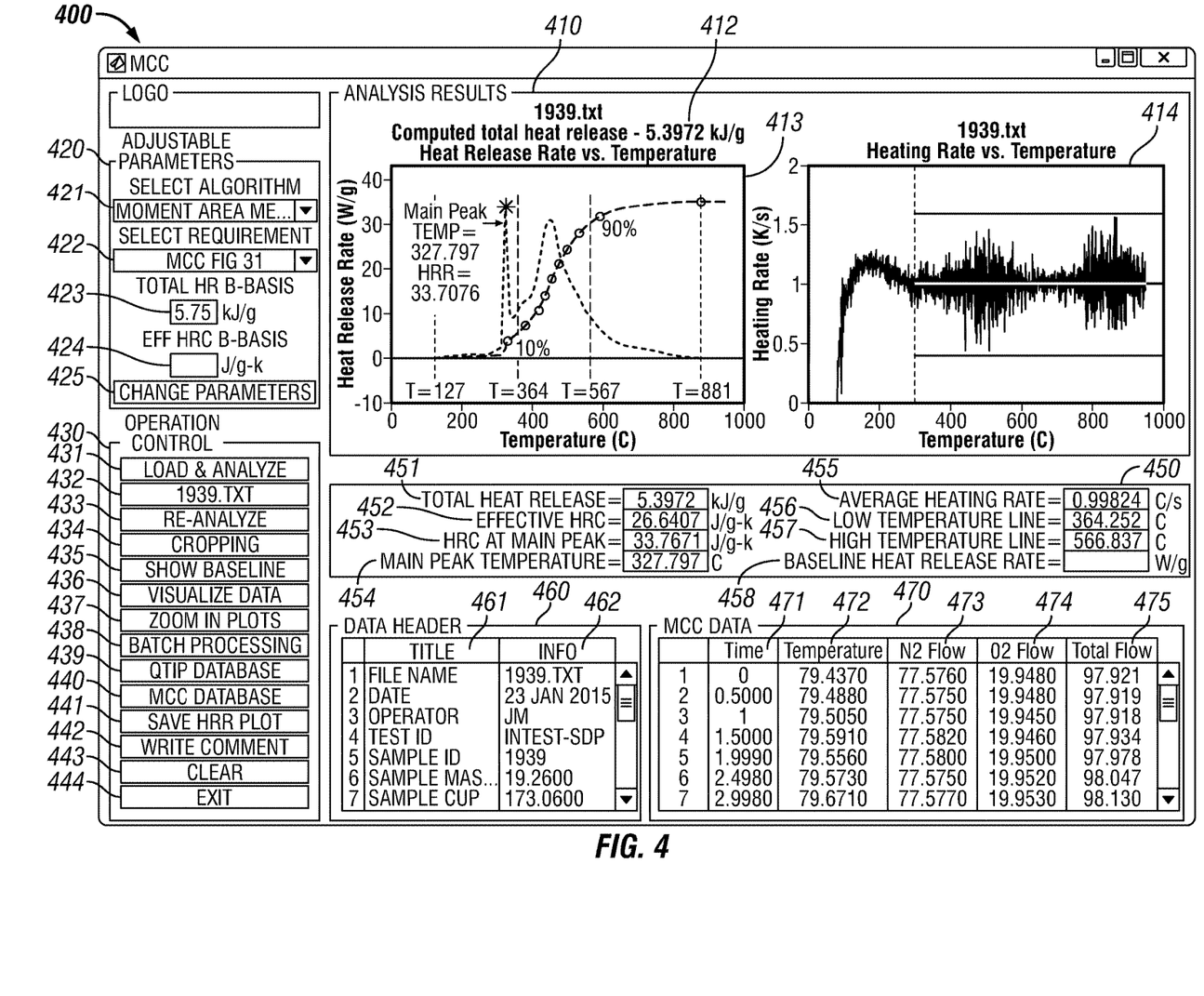
FIG. 4 is a visual diagram depicting an embodiment of a display window of a graphical user interface for MCC data manipulation and visualization.

Referring to FIG. 4, an embodiment of a display window 400 of a graphical user interface is depicted. The display window 400 may be generated by the system 300 to convey visual depictions of an MCC dataset received from an MCC device (e.g., the MCC device 110). The display window 400 may also depict the results of the analysis of the MCC dataset performed by the baseline correction module 320 and the analysis module 330.

The display window 400 may include an analysis results display 410, an adjustable parameter selection display 420, an operation control display 430, a parameter value display 450, a data header display 460, and an MCC data display 470.

The analysis results display 410 may include a text output 412. In some embodiments, the text output 412 may communicate a total heat release for an MCC dataset. The analysis results display 410 may further include a graphical data display 413 and a graphical data display 414. The displays 413, 414 may depict visualizations of various aspects of the MCC dataset, such as a visualization of heat release rates as a function of time as with the graphical display 413 and/or a visualization of a heating rate as a function of time as with the graphical display 414. The displays 413, 414 are further described with reference to FIGS. 5-7.

The adjustable parameters portion 420 may include an algorithm user selectable option input 421, a requirement user selectable option input 422, a total HR B-Basis text input 423, an effective HRC B-Basis text input 424, and a change parameters button input 425. The inputs 421-425 may enable a user to set the parameters for calculating and visualizing aspects of the MCC dataset. For example, the inputs 421-425 may provide a user with options for using different analysis algorithms, user supplied add-on algorithms, or methods for calculating and visualizing MCC data.

The operation control portion 430 may include a load and analyze button input 431, a filename text output 432, a re-analyze button input 433, a cropping button input 434, a show baseline button input 435, a visualize data button input 436, a zoom in plots button input 437, a batch processing button input 438, a QTIP database button option 439, an MCC database button input 440, a save heat release rate plot button input 441, a write comment button input 442, a clear button input 443, and an exit button input 444. The inputs 431-444 may enable a user to control the operation of the system 300 as described herein.

To illustrate, the inputs 431-433 may deal with loading and performing an analysis of MCC data. The inputs 434-437 may deal with adjusting visualizations of the MCC data. In some embodiments, the inputs 434-437 may alter the contents of the displays 413, 414. Alternatively, in some embodiments, the inputs 434-437 may cause new display windows to open to display the respective properties of the MCC data. The input 438 may enable processing multiple files or MCC data matrices automatically as a batch process. The inputs 439-441 may enable saving of the corrected MCC dataset and calculation results. This data may be saved to a database, e.g., the database 140, or to a filesystem. The input 442 may enable users to write notes corresponding to the MCC data and calculations. The input 443 may enable users to clear graphics and numerical displays 410, 450, 460, 470. The input 444 may enable a user to exit the graphical user interface.

The parameter value display 450 may include a total heat release value 451, an effective heat release capacity value 452, a heat release capacity at main peak value 453, a main peak temperature 454, an average heating rate value 455, a low temperature line value 456, a high temperature line value 457, and a baseline heat release rate value 458. These values may correspond to the results of the computations performed by the analysis module 330. The values are described further with reference to FIGS. 11 and 12.

The data header display 460 may include a title column 461 and an info column 462. The title column 461 may list attributes associated with the MCC dataset file and the info column 462 may list values associated with the attributes.

The MCC data display 470 may include a time column 471, a temperature column 472, a nitrogen flow column 473, an oxygen flow column 474, a total flow column 475, and additional columns (not shown) that correspond to other dataset field values. The values displayed in the MCC data display 470 may correspond to the raw MCC data before it is corrected using a baseline as described herein.

An advantage associated with the display window 400 is that it provides a user with MCC data in a form that is usable for analysis of combustion. The parameter value display 450 also shows many values, which have been automatically calculated, and are useful for the analysis of MCC data. This enables users to have access to additional information as opposed to systems that do not perform corrections and calculations automatically.

Figure 5:
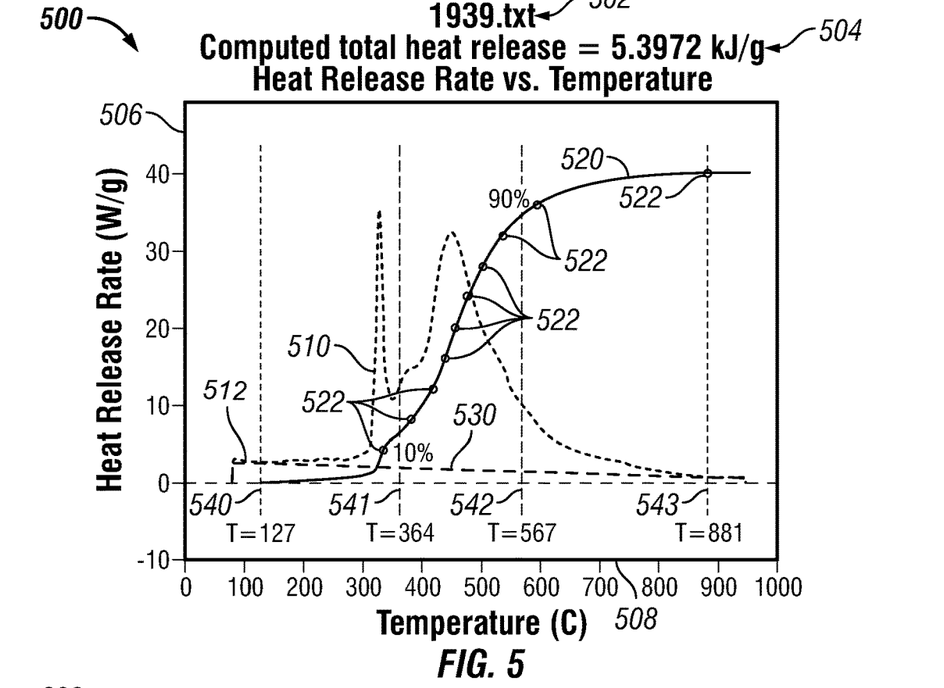
FIG. 5 is a visual diagram depicting an embodiment of a display of a graphical user interface for MCC data manipulation and visualization.

Referring to FIG. 5, an embodiment of a display 500 is depicted. The display 500 may correspond to the display 413 of FIG. 4 or, in the alternatively, the display 500 may correspond to a display within a separate display window. The display 500 may be shown in response to selection of the show baseline selectable option 435 of the display window 400.

In some embodiments, the display 500 may include a filename value 502, a computed total heat release value 504. The display 500 may further include a heat release rate axis 506 and a temperature axis 508. A heat release rate plot 510 may graphically convey heat release rates as a function of temperature. The heat release rate plot 510 may be plotted according to the dataset received from the MCC device 110. The display 500 may further include a combustion progress plot 520. Markers 522 may be included along the combustion plot 520 to indicate a percentage of combustion that has occurred. A baseline plot 530 may be superimposed on the heat release rate plot 510. The display 500 may also include temperature markers 540-543 that indicate temperatures associated with particular burn phases of the sample being tested.

The display 500 may enable a user to visualize the dataset received from the MCC device before it is corrected according to the baseline. For example, the heat release plot 510 includes an artifact shoulder 512 at lower temperatures. The artifact shoulder 512 may be due to inaccuracies associated with the MCC device 110. For example, as described herein, the artifact shoulder 512 may be cause by expanding gases within the MCC device 110 rather than combustion of the sample. As such, the artifact shoulder 512 represents an error associated with the dataset as received from the MCC device 110. The baseline plot 510 visually indicates to a user a baseline that may be used to correct the dataset. The baseline may correspond to a calculated baseline as described herein.

Figure 6:
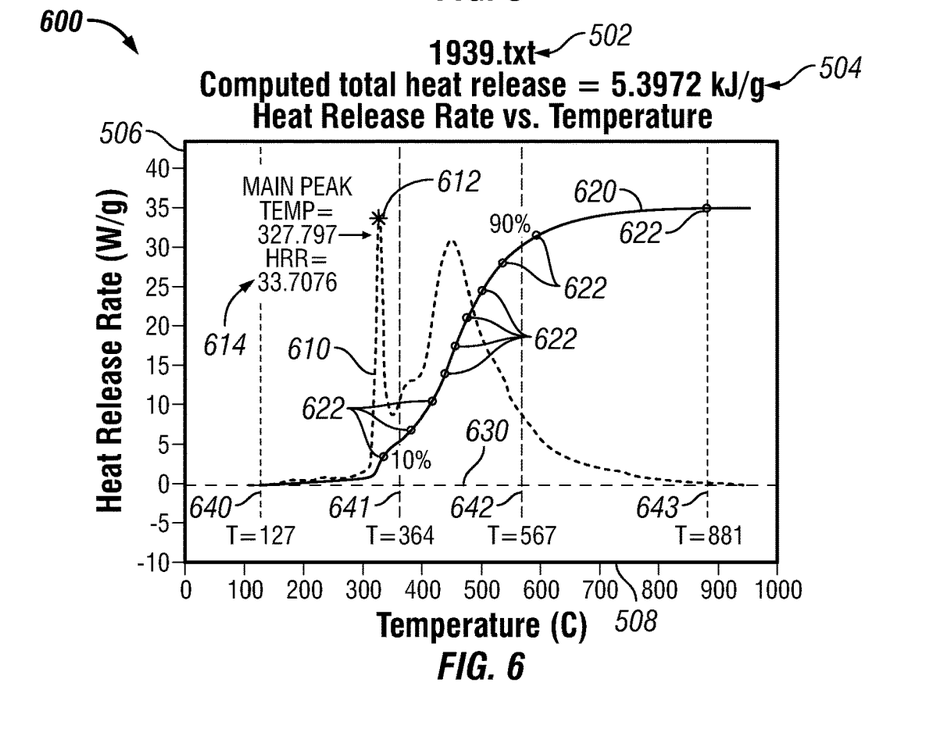
FIG. 6 is a visual diagram depicting an embodiment of a display of a graphical user interface for MCC data manipulation and visualization.

Referring to FIG. 6, an embodiment of a display 600 is depicted. The display 600 is similar to the display 500. However, the display 600 depicts a heat release rate plot 610 that is plotted based on a modified dataset. The modified dataset is corrected according to a baseline as described herein. In some embodiments, the display 600 may be shown in response to selection of the load and analyze selectable option 431 or the re-analyze selectable option 433.

The heat release rate plot 610 may include a marker 612 indicating a main heat release peak. The marker 612 may be associated with one or more values 614 associated with the main peak. For example, the one or more values may include a temperature value associated with the main peak and a heat release rate associated with the main peak. Although FIG. 6 depicts the marker 612 as located at the main peak, in other embodiments, additional markers may be located at other portions of the heat release rate plot 610. Further, in some embodiments, the location of the marker 612 may depend on user input. For example, the display 600 may enable user tracing of the plot 610.

The display 600 may include a combustion progress plot 620 that includes combustion progress indicators 622. The display 600 may also include temperature markers 640-643 that indicate temperatures associated with particular burn phases of the sample being tested. A baseline plot 630 may appear as a horizontal line because the data depicted in the display 600 has been normalized based on the baseline. As such, the heat release rate plot 610 may be more accurate as compared to the heat release rate plot 510.

Figure 7:
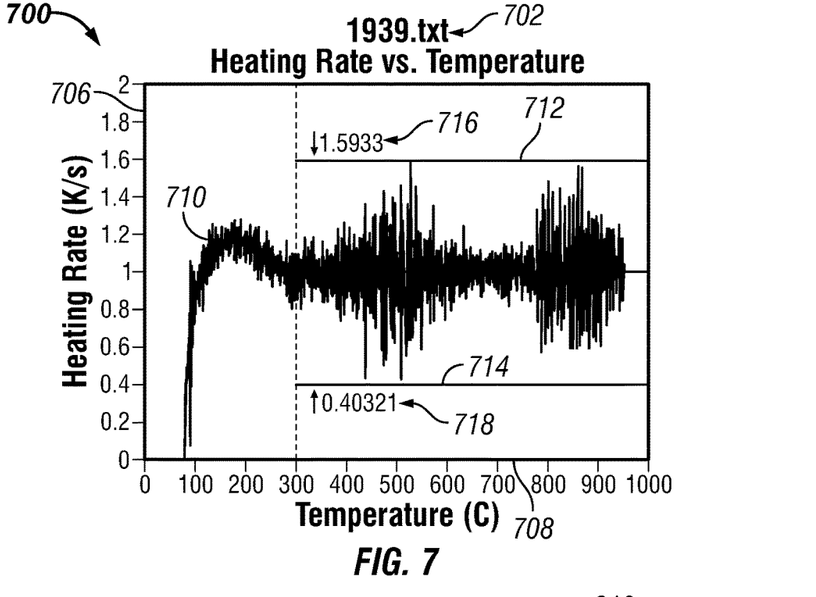
FIG. 7 is a visual diagram depicting an embodiment of a display of a graphical user interface for MCC data manipulation and visualization.

Referring to FIG. 7, an embodiment of a display 700 is depicted. The display 700 may correspond to the display 414. The display 700 may include a filename value 702. The display 700 may further include a heating rate axis 706 and a temperature axis 708. The display 700 may also include a heating rate plot 710 depicting a heating rate of a sample as a function of temperature. The display may also include an upper limit indicator 712 and a lower limit indicator 714. The upper limit indicator 712 may be associated with an upper limit deviation value 716. The lower limit indicator 714 may be associated with a lower limit deviation value 718.

The quality of a dataset received from an MCC device is dependent on heating the sample at a constant rate. By displaying the heating rate plot 710, the display 700 may indicate to a user whether the heating rate of the sample was constant and the range at which the heating rate deviated from a target heating rate.

Figure 8:
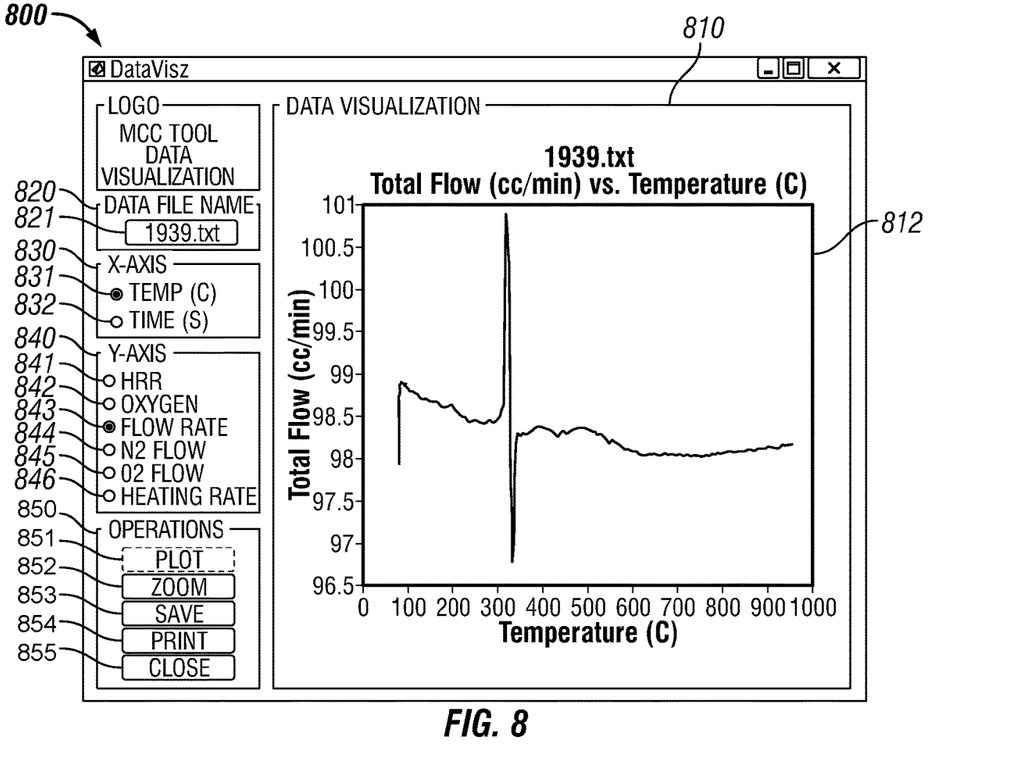
FIG. 8 is a visual diagram depicting an embodiment of a display window of a graphical user interface for MCC data manipulation and visualization.

Referring to FIG. 8, an embodiment of a display window 800 for data visualization is depicted. The display window 800 may be displayed in response to user selection of visualize data user selectable option 436 of the display window 400.

The display 800 may include a data visualization display 810, a data file name display 820, an x-axis display 830, a y-axis display 840, and an operations display 850.

The data visualization display 810 may include a display 812. The display 812 may graphically depict aspects of a dataset received from an MCC device. The aspects that are depicted by the display 812 may depend on selections made in the x-axis display 830 and the y-axis display 840. As an example, FIG. 8 depicts the display 812 as graphically depicting a total flow rate as a function of temperature. Other selections may be made.

The data file name display 820 may include a file name text output 821. The file name text output 821 may indicate a filename associated with the dataset used to generate the display 812. For example, the file name output 821 may output the same file name as received via the filename text output 432 of FIG. 4.

The x-axis display 830 may include a temperature selectable option 831 and a time selectable option 832. These selectable options may be used to modify which data matrix associated with the MCC dataset is used as a domain for the display 812. For example, FIG. 8 depicts the selection of the temperature selectable option 831. As such, the plot depicted in the display 812 shows information as a function temperature. Upon selection of the time selectable option 832, the display 812 may be modified to show the information as a function of time.

The y-axis display 840 may include a heat release rate selectable option 841, an oxygen selectable option 842, a flow rate selectable option 843, a nitrogen flow selectable option 844, an oxygen flow selectable option 845, and a heating rate selectable option 846. These selectable options may be used to modify which data matrix associated with the dataset is used as a range for the display 812. For example, FIG. 8 depicts the selection of the flow rate selectable option 843. As such, the plot depicted in the display 812 shows a total flow rate as a function of whichever domain is selected (e.g., temperature or time). Upon selection of one of the other selectable options 841-846, the display 812 may be modified to show values corresponding to the newly selected option.

The operations display 850 may include a plot button input 851, a zoom button input 852, a save button input 853, a print button input 854, and a close button input 855. The inputs 851-855 may be used to control functions of the data visualization display 810. For example, the plot button input 851 may generate or modify the plot depicted in the display 812 based on changes input via the x-axis display 830 and the y-axis display 840. The inputs 852-855 may control other options with respect to the display window 800.

Figure 9:
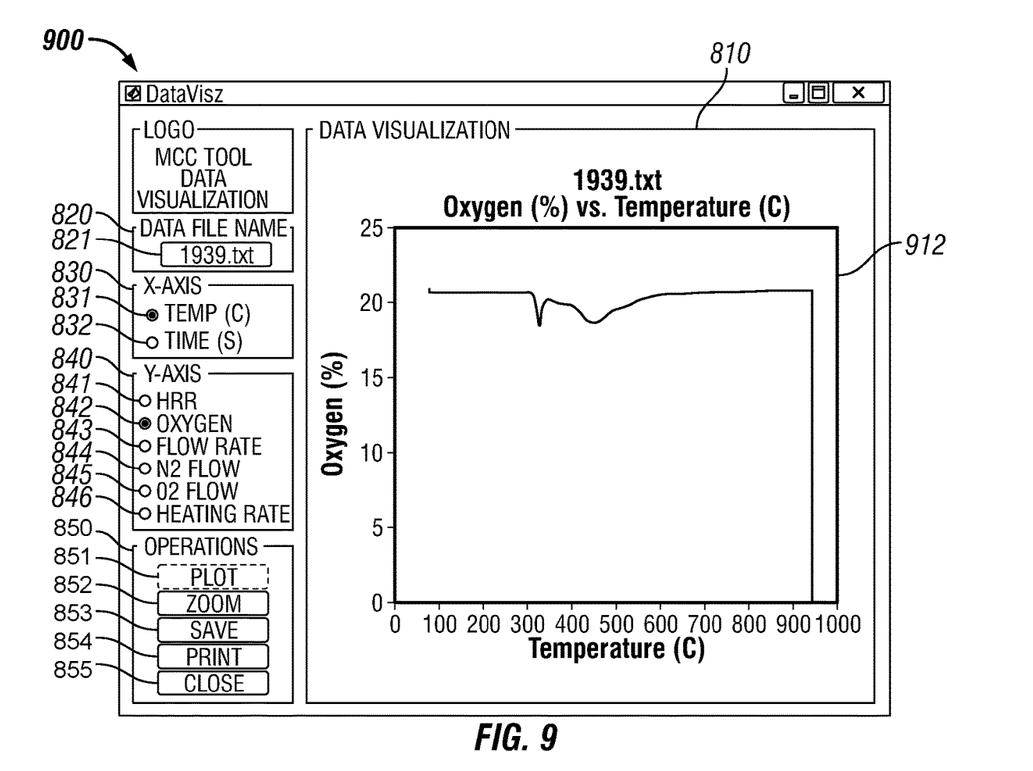
FIG. 9 is a visual diagram depicting an embodiment of a display window of a graphical user interface for MCC data manipulation and visualization.

Referring to FIG. 9, an embodiment of a display window 900 for data visualization is depicted. The display window 900 may correspond to the display window 800 of FIG. 8, however, FIG. 9 depicts selection of the oxygen selectable option 842 instead of the flow rate selectable option 843. As such, a display 912 depicts a percentage of oxygen as a function of temperature. Other displays may be generated based on other selections.

Figure 10:
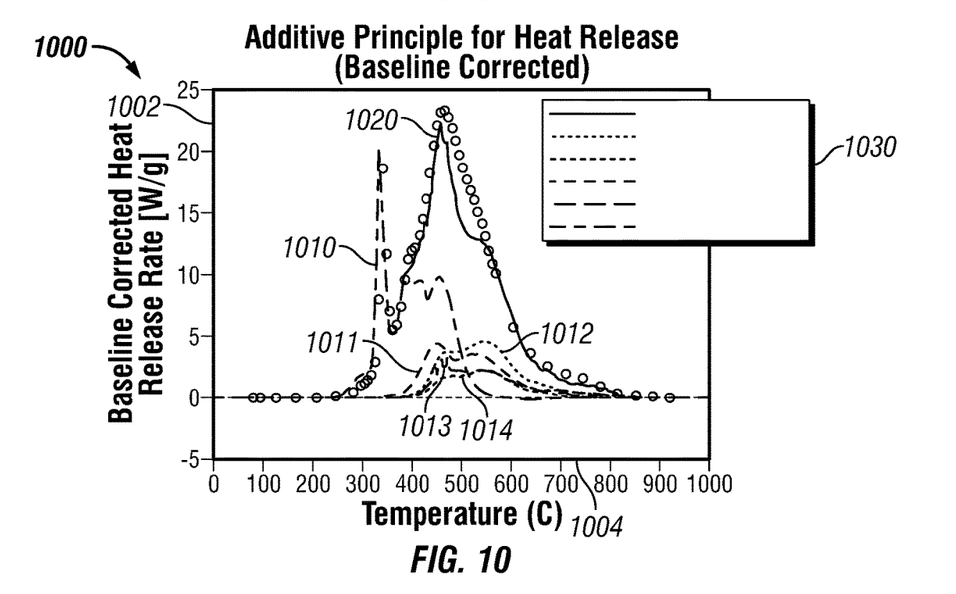
FIG. 10 is a visual diagram depicting an embodiment of a display of a graphical user interface for MCC data manipulation and visualization.

Referring to FIG. 10, an embodiment of a display 1000 is depicted. The display 1000 may be shown in a separate display window in response to selection of the visualize data selectable option 435. Alternatively, the display 1000 may correspond to one or more of the display 413, the display 812, and the display 912, depending on the selection of user selectable options. As depicted in FIG. 10, the display 1000 may include a baseline corrected heat release rate axis 1002 and a temperature axis 1004.

The display 1000 may depict data associated with multiple component peaks as a function of temperature. The multiple component peaks may add to form the total heat release rates as a function of temperature. To illustrate, the display 1000 may include a plot 1020 depicting the total heat release rates. The display 1000 may further include a plot 1010 associated with a first component peak, a plot 1011 associated with a second component peak, a plot 1012 associated with a third component peak, a plot 1013 associated with a fourth component peak, and a plot 1014 associated with a fifth component peak. The functional sum of each of the plots 1010-1014 may equal the plot 1020. The display 1000 may also include a key 1030 for associating each of the plots 1010-1014 to an associated component peak.

In some embodiments the analysis module 330 may calculate total heat release (THR) data from stored MCC data corresponding to multiple materials that have been tested separately. The calculated data and stored data may be visualized together as depicted by the display 1000. The plot 1020 may be estimated by summing the corrected heat release of component materials, depicted by the plots 1010-1014. The corrected heat release of each component material may be calculated by multiplying the total heat release of each separately tested component by its weight as a percentage of the composite panel. The display 1000 may also include data points (depicted as circles) indicating heat release values for the entire panel.

The component peaks may be automatically and iteratively calculated by the analysis module 330. An advantage of automatically, iteratively calculating the component peaks 1010-1014 is that they may be calculated to more accurately than systems that rely on a user determination (often by mere guesswork) of the component peaks. Because the peaks are calculated more accurately, they better reflect the additive property and are better suited for use in combustion analysis. Other advantages and benefits of the display 1000 may be apparent to persons of ordinary skill having the benefit of this disclosure.

Figure 11:
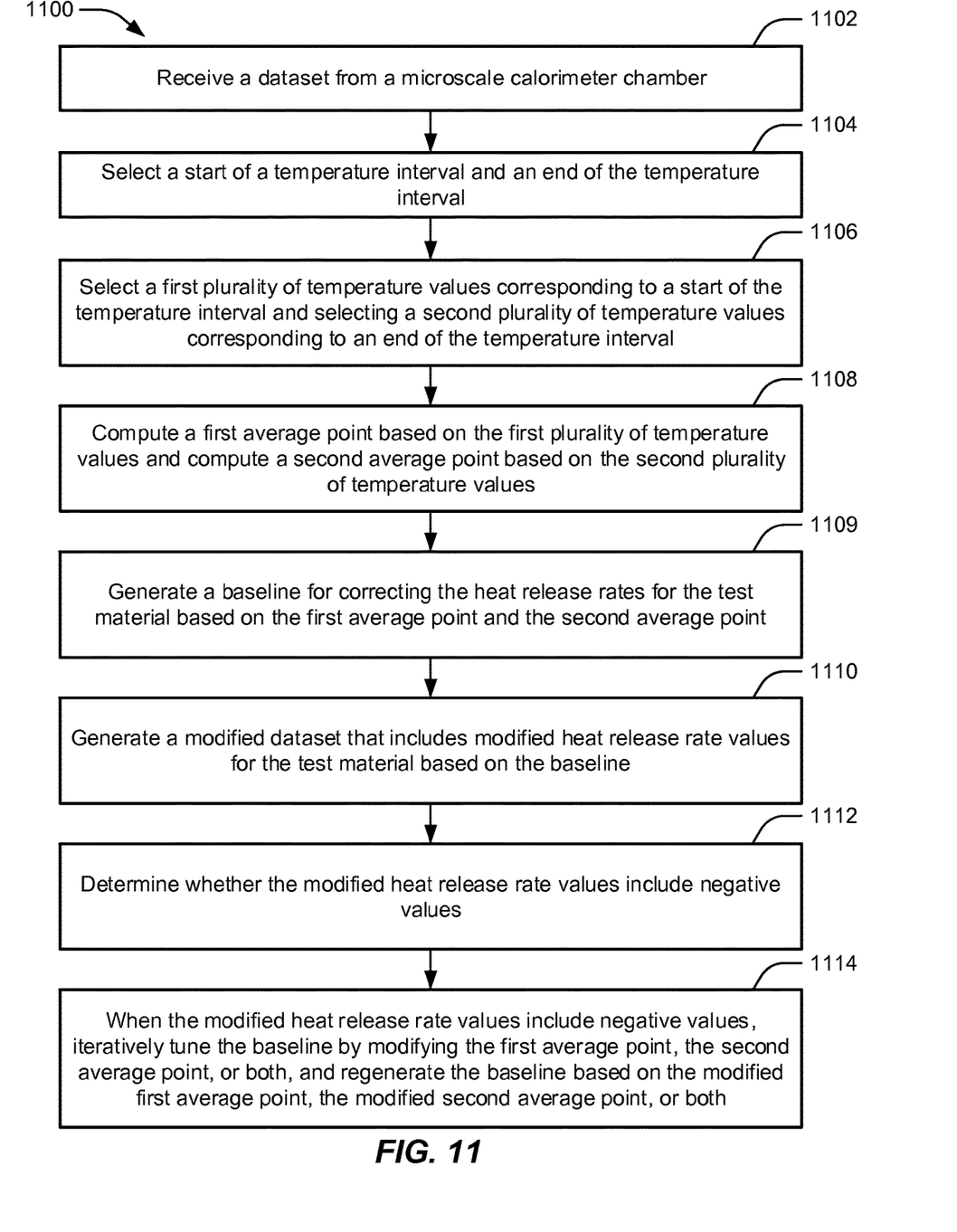
FIG. 11 is a flow diagram depicting an embodiment of a method of selecting a baseline for MCC data manipulation and visualization.

Referring to FIG. 11, a flowchart of an embodiment of a method of selecting a baseline is depicted and generally designated 1100. The method 1100 may be performed by the baseline correction module 320.

The method 1100 may include receiving a dataset from a microscale calorimeter chamber, at 1102. The dataset may be indicative of heat release rates for a test material as a function of a temperature applied by the microscale calorimeter chamber to the test material.

The method 1100 may further include selecting a start of a temperature interval and an end of the temperature interval, at 1104. The temperature interval may be selected by a user via the adjustable parameters portion 420 of the display 400. Alternatively, the interval may be selected by a user by clicking on a portion of the display 413. Other methods of selecting the interval may also be employed. In some embodiments, a default start may be 120° C. A default end may be 900° C. or the last non-zero heat release rate of the MCC dataset.

The method 1100 may also include selecting a first plurality of temperature values corresponding to a start of the temperature interval and selecting a second plurality of temperature values corresponding to an end of the temperature interval, at 1106. For example, the first plurality of temperature values may be proximate to the start and the second plurality of temperatures may be proximate to the end. In some embodiments, at least 10 temperature values may be selected for the start and 10 temperature values may be selected for the end. The temperature values may be selected automatically by the baseline correction module 320.

The method 1100 may include computing a first average point based on the first plurality of temperature values and computing a second average point based on the second plurality of temperature values, at 1108. The first average point may include a first average heat release rate value and a first temperature value corresponding to the first average heat release rate. The second average point may include a second average heat release rate value and a second temperature value corresponding to the second average heat release rate. The average points may be determined by taking a mean average of each of the heat release rate points corresponding to the plurality of temperature values for both the start of the temperature interval and the end of the temperature interval.

The method 1100 may further includes generating a baseline for correcting the heat release rates for the test material based on the first average point and the second average point, at 1109. The baseline may be computed using a two-point formula to develop a slant baseline from the first average point and the second average point.

The method also includes generating a modified dataset that includes modified heat release rate values for the test material based on the baseline, at 1110. For example, the baseline correction module 320 may modify heat release rate values from the MCC data to subtract, or otherwise cancel, portions of the heat release rate values that fall below the baseline.

The method 1100 includes determining whether the modified heat release rate values include negative values, at 1112. For example, after the heat release rate values are modified, the baseline correction module 320 may determine whether any of the heat release rate values, as modified, are negative. If so, then further adjustment of the baseline may yield more accurate values.

The method 1100 further includes, when the modified heat release rate values include negative values, iteratively tuning the baseline by modifying the first average point, the second average point, or both, and regenerating the baseline based on the modified first average point, the modified second average point, or both, at 1114. For example, the baseline correction module 320 may add or remove temperature values from the first plurality of temperature values or the second plurality of temperature values to make slight adjustments to the average points at the start and end of the interval. A new baseline may be determined and new heat release values may be calculated. The baseline correction module 320 may iteratively perform this "fine tuning" until it results in a set of corrected heat release values that includes no negative values.

Referring to FIG. 12, a flowchart of an embodiment of a method of modifying a dataset and generating analysis values is depicted and generally designated 1200. The method 1200 may include selecting a baseline, and determining a starting and ending temperature interval, at 1202. Selecting the baseline, and determining the starting and ending temperature interval may correspond to the method 1100. As such, the baseline selection module 320 may perform selection of the baseline.

In some embodiments, the baseline may be represented mathematically as:

$$y = \alpha \cdot x + \beta$$

which represents a straight line with a slope $\alpha$ and an offset $\beta$. Because the dataset is based on measurements taken periodically (e.g., every half second), the temperature interval may include a corresponding time interval. The interval may be represented by a starting temperature, $T_{start}$, a starting time, $t_{start}$, an end temperature, $T_{end}$, and an end time, $t_{end}$. Using the baseline, the dataset may be corrected to reflect heat release rates associated with the sample while reducing or eliminating artifact portions of each heat release rate due to the expansion of gas as described herein. The calculated baseline may model the artifact portions. By subtracting, or otherwise canceling, the baseline from the heat release rates indicated by the dataset, a modified dataset may be generated that is more accurate than the dataset received from the MCC device. Correcting the heat release rate values based on the baseline may result in the following situation:

$$Q(T_{start})=Q(T_{end})=0,$$

where Q represents the baseline corrected heat release rates (in this case as a function of temperature). Various intermediate computations may also be performed using the corrected heat release rates. For example, for each temperature, a total heat release as a function of the temperature may be computed as follows:

$$Q_T(T) = \int_{T_{start}}^{T} Q(x)dx,$$

where $Q_T(T)$ is a total heat release up to the temperature T as a function of temperature and x is a measured temperature as applied by the MCC device. Further, for the entire temperature interval, a total heat release value $Q_T$ may be computed as follows:

$$Q_T = \int_{T_{start}}^{T_{end}} Q(T)dT.$$

The method 1200 may also include computing an average heat release rate corresponding to the selected temperature interval of the dataset, at 1204. For example, the analysis module 330 may compute an average heat release rate corresponding to the selected interval of an MCC dataset received from the MCC device 110.

In some embodiments, computing the average heat release rate may include several intermediate computations. For example, for each temperature, a total of moments, up to the temperature may be calculated as follows:

$$\int_{T_{start}}^{T} x*Q(x)dx.$$

and for the temperature interval, a total of moments may be calculated as follows:

$$\int_{T_{start}}^{T_{end}} T*Q(T)dT.$$

The mean temperature μ may be calculated as follows:

$$\mu = \frac{\int_{T_{start}}^{T_{end}} T*Q(T)\,dT}{\int_{T_{start}}^{T_{end}} Q(T)\,dT} = \frac{\int_{T_{start}}^{T_{end}} T*Q(T)\,dT}{Q_T}.$$

In some embodiments, the mean temperature μ may correspond to the average heat release rate corresponding the selected temperature interval of the dataset.

The method 1200 may include computing a variance of the heat release rates corresponding to the selected temperature interval of the dataset, at 1206. For example, the analysis module 330 may calculate the variance based on the MCC dataset.

In some embodiments, computing the variance of the heat release rates may include several intermediate computations. For example, for each temperature, a total of moments, up to the temperature may be calculated as follows:

$$\int_{T_{start}}^{T}(x-\mu)^2*Q(x)dx,$$

and for the temperature interval a total of moments may be calculated as follows:

$$\int_{T_{start}}^{T_{end}}(x-\mu)^2*Q(T)dT.$$

The variance $\Delta T^2$ may be calculated as follows:

$$\Delta T^2 = \frac{\int_{T_{start}}^{T_{end}}(x-\mu)^2*Q(T)\,dT}{\int_{T_{start}}^{T_{end}} Q(T)\,dT} = \frac{\int_{T_{start}}^{T_{end}}(x-\mu)^2*Q(T)\,dT}{Q_T}.$$

The method 1200 may further include computing a vigorous burning temperature interval based on the variance of the heat release rates, at 1208. The vigorous burning temperature may be defined as twice the standard deviation. In some embodiments, the compute the vigorous burning temperature interval, a standard deviation ΔT may be computed as follows:

$$\Delta T = \sqrt{\Delta T^2}.$$

The method 1200 may also include computing a total heat release value corresponding to the selected temperature interval, at 1210. In some embodiments, the total heat release THR may be computed as follows:

$$\int_{T_{start}}^{t_{end}} Q(t)dt.$$

The method 1200 may include computing an effective heat release capacity based on the vigorous burning temperature and based on the total heat release value, at 1212. In some embodiments, a heat release capacity $\eta_c$ may be computed as follows:

$$\eta_c = \frac{THR}{2\Delta T}.$$

In some embodiments the methods described herein may be performed or initiated by a processor in response to instructions stored at a non-transitory computer-readable medium. For example, the instructions may cause the processor to perform one or more of the operations described with reference to the system 100 and the system 300. The instructions may cause the processor to generate the graphical user interface 400 and at least one of the display 500, the display 600, the display 700, the display 800, the display 900, and the display 1000. The instructions may further cause the processor to perform one or more of the operations described with reference to the method 1100 and the method 1200.

Although various embodiments have been shown and described, the present disclosure is not so limited and will be understood to include all such modifications and variations are would be apparent to one skilled in the art.

What is claimed is:

1. A method for improving the accuracy of data generated by a microscale calorimeter chamber system, the method comprising:

receiving, at a computing device, a dataset from a microscale calorimeter chamber, the dataset indicative of heat release rates for a test material as a function of a temperature applied by the microscale calorimeter chamber to the test material;

computing a first average point at a start of a selected temperature interval, the first average point including an average of heat release rates corresponding to a first plurality of temperature values from the dataset corresponding to the start of the selected temperature interval;

computing a second average point at an end of the selected temperature interval, the second average point including an average of heat release rates corresponding to a second plurality of temperature values from the dataset corresponding to the end of the selected temperature interval;

generating a linear baseline extending from the first average point to the second average point;

generating a modified dataset by canceling the linear baseline from each heat release rate value of the dataset;

determining whether heat release rate values of the modified dataset include negative values;

in response to the modified heat release rate values including negative values, tuning the baseline by modifying the first average point, the second average point, or both, and regenerating the baseline based on the modified first average point, the modified second average point, or both; and displaying, via a graphical user interface, a graphical depiction of the modified dataset.

2. The method of claim 1, wherein the dataset includes a plurality of time values, each time value corresponding to one or more field values, the one or more field values including a temperature, a heat release rate value, a nitrogen flow rate value, an oxygen flow rate value, a total flow rate value, a heating rate value, or a combination thereof.

3. The method of claim 1, wherein the dataset is received at the computing device via a serial or parallel data connection to the microscale calorimeter chamber.

4. The method of claim 1, further comprising receiving, at the computing device, user input indicating selection of the selected temperature interval.

5. The method of claim 1, further comprising:
computing an average heat release rate corresponding to the selected temperature interval of the dataset; and
displaying, via the graphical user interface, a numerical indication of the average heat release rate.

6. The method of claim 1, further comprising:
computing a variance of the heat release rates corresponding to the selected temperature interval of the dataset.

7. The method of claim 6, further comprising:
computing a vigorous burning temperature interval based on the variance of the heat release rates;
computing a total heat release value corresponding to the selected temperature interval;
computing an effective heat release capacity based on the vigorous burning temperature and based on the total heat release value; and
displaying, via the graphical user interface, a numerical indication of the total heat release.

8. The method of claim 1, further comprising:
determining temperatures associated with different combustion phases; and
displaying, via the graphical user interface, a graphical depiction of the different combustion phases.

9. The method of claim 1, further comprising:
estimating heat release rates for a composite material that includes the test material and at least another test material by performing a weighted sum of heat release rate values of the modified dataset for the test material and other heat release rate values for the other test material; and
displaying, via the graphical user interface, a graphical depiction of the estimated heat release rates for the composite material, the modified heat release rate values for the test material and the heat release rate values for the other test material.

10. A non-transitory computer-readable medium storing instructions that, when executed by a processor, cause the processor to perform operations comprising:
receiving a dataset generated by a microscale calorimeter chamber, the dataset indicative of heat release rates for a test material as a function of a temperature applied by the microscale calorimeter chamber to the test material;
computing a first average point at a start of a selected temperature interval, the first average point being an average of a first plurality of heat release rates corresponding to temperature values from the dataset corresponding to the start of the selected temperature interval;
computing a second average point at an end of the selected temperature interval, the second average point being an average of a second plurality of heat release rates corresponding to temperature values from the dataset corresponding to the end of the selected temperature interval;
generating linear baseline data extending from the first average point to the second average point;
generating a modified dataset by canceling the linear baseline from each heat release rate value of the dataset;
determining whether heat release rate values of the modified dataset include negative values;
in response to the modified heat release rate values including negative values, tuning the baseline by modifying the first average point, the second average point, or both, and regenerating the baseline based on the modified first average point, the modified second average point, or both; and
generating a graphical user interface that includes a display that graphically depicts the modified dataset.

11. The non-transitory computer-readable medium of claim 10, wherein the graphical user interface includes at least one user selectable option to enable selection of at least one parameter setting from a set of parameter settings, the set of parameter settings including at least a moment area measurement setting.

12. The non-transitory computer-readable medium of claim 10, wherein the display further depicts a computed total heat release value.

13. The non-transitory computer-readable medium of claim 10, wherein the display further depicts combustion progress indicators.

14. The non-transitory computer-readable medium of claim 10, wherein the display further depicts temperatures of different combustion phases.

15. The non-transitory computer-readable medium of claim 10, wherein the graphical user interface includes a graphical display depicting a heating rate of the microscale calorimeter chamber as a function of temperature.

16. The non-transitory computer-readable medium of claim 10, wherein the graphical user interface further includes a display of at least one numerical result corresponding to an analysis of the modified dataset, the at least one numerical result including at least one of a total heat release, an effective heat release capacity, a heat release capacity at a main peak, a main peak temperature, an average heating rate, a low temperature line, a high temperature line, and a baseline heat release rate.

* * * * *